(12) United States Patent
Cho et al.

(10) Patent No.: US 6,219,297 B1
(45) Date of Patent: Apr. 17, 2001

(54) DYNAMIC RANDOM ACCESS MEMORY THAT CAN BE CONTROLLED BY A CONTROLLER FOR A LESS INTEGRATED DYNAMIC RANDOM ACCESS MEMORY

(75) Inventors: Chang-bum Cho, Sungnam; Jun-young Jeon, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/478,973

(22) Filed: Jan. 6, 2000

(30) Foreign Application Priority Data

Jan. 6, 1999 (KR) ........................................... 99-106

(51) Int. Cl.$^7$ ...................................................... G11C 8/00
(52) U.S. Cl. ................................ 365/230.06; 365/230.08
(58) Field of Search ........................ 365/230.06, 230.08, 365/189.05, 189.09, 185.23

(56) References Cited

U.S. PATENT DOCUMENTS

| | | | |
|---|---|---|---|
| 4,884,240 | * 11/1989 | Dennison et al. | 365/189.09 |
| 5,633,832 | * 5/1997 | Patel et al. | 365/230.06 |
| 5,781,481 | * 7/1998 | Iwakiri | 365/189.11 |
| 5,949,716 | * 9/1999 | Wong et al. | 365/185.29 |
| 6,044,020 | * 3/2000 | Chung et al. | 365/185.23 |

* cited by examiner

Primary Examiner—Richard Elms
Assistant Examiner—Anh Phung
(74) Attorney, Agent, or Firm—Skjerven Morrill MacPherson LLP; David Millers

(57) ABSTRACT

A semiconductor memory device is disclosed. The device can be controlled by a controller for another less integrated memory device. The device includes a set of a first memory cell array and a second memory cell array having word lines, a row decoding unit which simultaneously activates the first memory cell array and the second memory cell array, and pairs of input and output lines through which data transfer from and to the first memory cell array and the second memory cell array. The row decoding unit includes a decoder which decodes the row address, a first word line driver, and a second word line driver. The first word line driver, which connects to the power supply voltage, transmits the decoded row address to the first memory cell array so as to select the word lines corresponding to the row address among the word lines of the first memory cell array. The second word line driver, which connects to the ground voltage, transmits the decoded row address to the second memory cell array so as to select the word lines corresponding to the row address among the word lines of the second memory cell array.

9 Claims, 6 Drawing Sheets

DYNAMIC RANDOM ACCESS MEMORY THAT CAN BE CONTROLLED BY A CONTROLLER FOR A LESS INTEGRATED DYNAMIC RANDOM ACCESS MEMORY

BACKGROUND OF THE INVENTION

1. Field of the Invention

The present invention relates to a semiconductor memory device, and more particularly, to a highly integrated dynamic random access memory (DRAM) that connects to a DRAM controller for a less integrated DRAM.

2. Description of the Related Art

DRAMs have been widely used in computers. In a computer, a DRAM controller controls writing and reading of data to and from the DRAMs. Accordingly, a row or column address output from a DRAM controller should have the same number of address bits as the address input to the DRAM, and the number of address pins of the DRAM controller should match the number of address pins of the DRAM.

Referring to FIG. 1A, a controller 101 for 128 Mb DRAM has twelve address pins 11 to 22, and a 128 Mb DRAM 111 has twelve address pins 51 to 62. Each of the twelve address pins 11 to 22 of controller 101 connects to a corresponding one of the twelve address pins 51 to 62 of 128 Mb DRAM 111. Therefore, when reading from or writing to 128 Mb DRAM 111, controller 101 issues a row address and a column address, each having up to twelve bits A0 to A11 through address pins 11 to 22, and 128 Mb DRAM 111 receives the address bits through address pins 51 to 62.

In contrast, referring to FIG. 1B, controller 101 has twelve address pins 11 to 22 for a 128 Mb DRAM, and a 256 Mb DRAM has thirteen address pins 71 to 83 and requires a row or column address with up to thirteen bits for access of the full address space of DRAM 131. Since the number of address pins 11 to 22 supported by DRAM controller 101 is less than the number of address pins 71 to 83 required by DRAM 131, DRAM controller 101 cannot control DRAM 131.

Referring to FIG. 2, a conventional 256 Mb (64M×4 bits) DRAM 201 includes pads 250 to 262, address buffers 270 to 282, a row decoder 211, first and second memory cell arrays 221 and 222, I/O (input/output) line sense amplifiers 231 to 238, and four pairs of I/O lines 100 to 103. A column decoder and associated circuitry that also connect to pads 250 to 262 are not shown but are well known in the art. Similarly, arrays 221 and 222 are simplified to only show column lines associated with columns selected by a column address received via pads 250 to 262.

The most significant row address bit A12 of row address bits A0 to A12 determines which of first and second memory cell arrays 221 and 222 will operate. For example, when the most significant row address bit A12 is logic high, bit A12 enables a row line driver 215 which assert a signal for accessing memory cells coupled to one of word lines $WL_0$ to $WL_n$ that address bits A0 to A11 select. Bit A12 disables a row line driver 216 from asserting the signal to word lines $WL_0$ to $WL_n$ in array 222 when row address bit A12 is a logic high. I/O line sense amplifiers 231 to 234 amplify data signals from memory cells on the selected word line and output the data via I/O (input and output) lines 100 to 103.

When the most significant row address bit A12 is logic low, row address bits A0 to A11 select one of word lines $WL_0$ to $WL_n$, and bit A12 enables word line driver 216 to assert the access signal from a decoder 213 to the selected word line in second memory cell array 222. Then, I/O line sense amplifiers 235 to 238 amplify data signals from memory cells on the selected word line and output the data via I/O (input and output) lines 100 to 103.

Referring to FIG. 3, a conventional 256 Mb (32M×8 bits) DRAM 301 includes pads 350 to 362, address buffers 370 to 382, a row decoder 311, first and second memory cell arrays 321 and 322, sense amplifiers 331 to 346, and pairs of I/O (input and output) lines 100 to 107. 256 Mb (32M×8 bits) DRAM 301 has a similar structure and operation to those of 256 Mb (64M×4 bits) DRAM 201 of FIG. 2, but accesses eight (instead of four) columns in array 321 or 322 for a read or write. As in FIG. 2, circuitry associated with column decoding is not shown in FIG. 3 but is well known in the art. For the 32M×8 memory fewer column address bits (i.e., twelve column address bits) are used rather than thirteen column address bits as in the 64M×4 memory. Both 64M×4 and 32M×8 use thirteen row address bits.

As mentioned above, a controller for 128 Mb DRAM cannot be used with conventional 256 Mb DRAM 201 or 301 of FIGS. 2 and 3 because a conventional 128 MB DRAM controller only provides twelve row address bits and memories 201 and 301 require thirteen row address bits. Accordingly, when memory ICs in a computer are upgraded, the upgraded memory ICs require a new controller. For cost-effective memory IC upgrading, a memory IC that can be operated by a controller for a memory IC having less memory capacity is necessary.

SUMMARY OF THE INVENTION

According to an aspect of the present invention, a highly integrated DRAM allows a DRAM controller for a less highly integrated DRAM to control the highly integrated DRAM. Accordingly, a computer can implement a high capacity memory using high capacity DRAM ICs and a DRAM controller designed for lower capacity DRAM ICs.

According to one embodiment of the invention, a semiconductor memory device includes first and second memory cell arrays. Each array includes $2^{n-1}$ word lines with each word line corresponding to a row address including (n−1) row address bits. A row decoder decodes first through (n−1)th row address bits and selects a word line from the word lines of the first memory cell array and a word line from the word lines of the second memory cell array. The DRAM replaces the most significant row address bit terminal among the n possible row address bits with a power supply voltage and a ground voltage to simultaneously enable the first and second memory cell arrays. Accordingly, the DRAM requires fewer row address bits than would normally be required for a DRAM IC of the same capacity. A plurality of pairs of input and output lines simultaneously transfer data bits from the first memory cell array and the second memory cell array.

In one embodiment, the semiconductor memory device is in a package including first through nth address pins for receiving address bits from the outside. The nth address pin is not electrically connected to provide the a row address bit to the semiconductor memory device. Instead, the fixed voltages are applied as described above to enable accesses simultaneous access to both memory cell arrays.

In a specific embodiment of the invention, a 256 Mb semiconductor memory device includes first and second memory cell arrays, and each memory cell array includes word lines associated with 12-bit row addresses. A row decoder decodes first through twelfth row address bits and selects the word lines among the word lines in the first memory cell array and the second memory cell array. Terminals of the row decoder for the thirteenth address bit receives a power supply voltage for one memory cell array and a ground voltage for the other memory cell array, and thereby simultaneously enables the first and second memory cell arrays. The 256 Mb device has 8 (or 16) input and output lines for 8 (or 16) bits of parallel data, including four (or eight) bits of data associated with the first memory cell array and four (or eight) bits of data associated with the second memory cell array.

The highly integrated or high capacity DRAM ICs according to the present invention can enlarge the memory capacity of a computer system using a DRAM controller for lower capacity DRAM ICs. Further, the architecture of the DRAM is flexible so that that wire bonding during packaging or electronic configuration can select the number of row address bits that the DRAM requires from a controller.

BRIEF DESCRIPTION OF THE DRAWING(S)

The features and advantages of the present invention will become more apparent by describing specific embodiments thereof with reference to the attached drawings, in which.

Use of the same reference symbols in different figures indicates similar or identical items.

DESCRIPTION OF THE PREFERRED EMBODIMENT(S)

Figure 4:
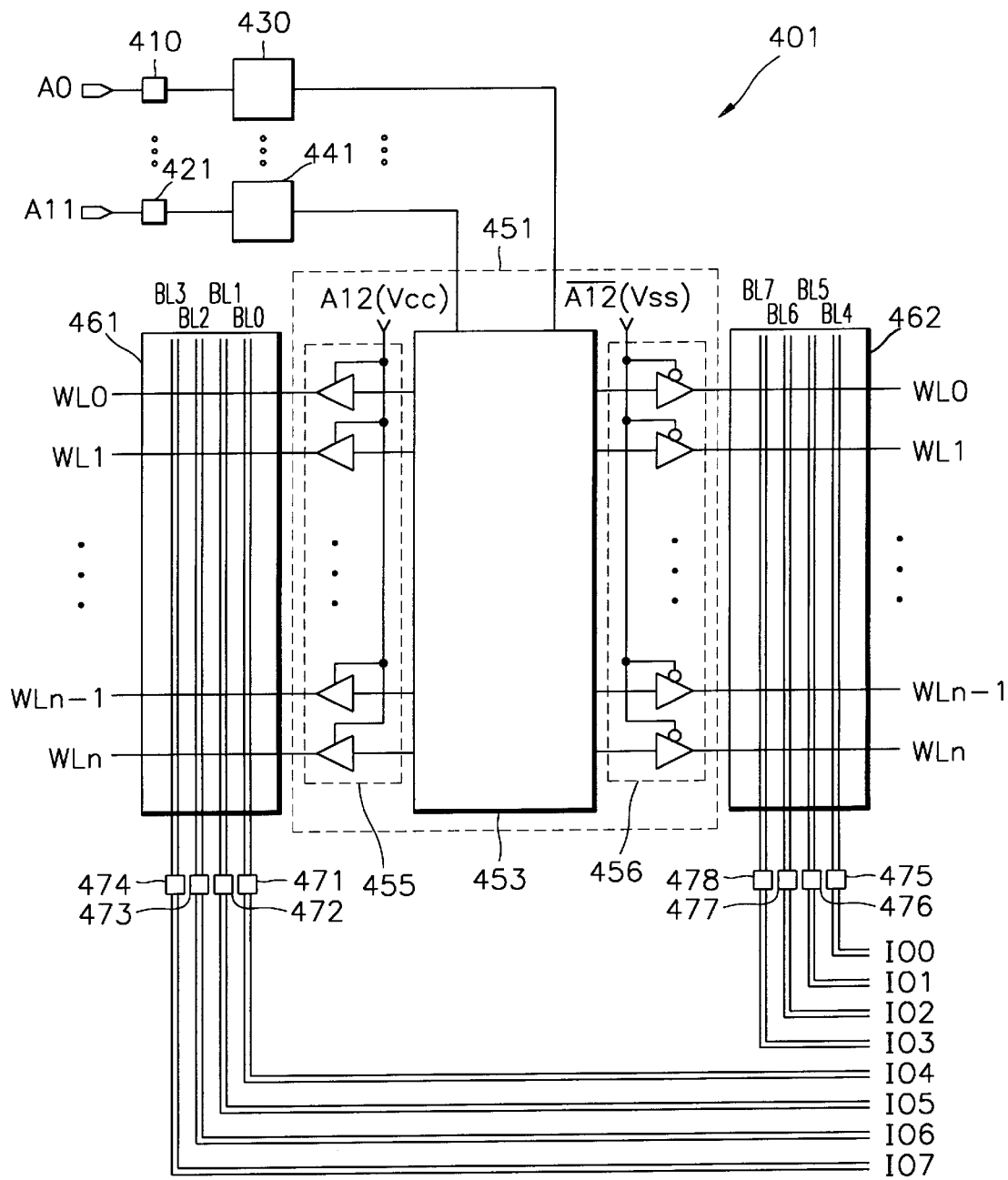
FIG. 4 is a block diagram of a 256 Mb (64M×4 bits) DRAM according to an embodiment of the present invention.

FIG. 4 is a circuit diagram of a 256 Mb (32M×8 bits) DRAM 401 in accordance with an embodiment of the present invention. DRAM 401 includes pads 410 to 421, address buffers 430 to 441, a row decoder 451, first and second memory cell arrays 461 and 462, I/O line sense amplifiers 471 to 478, and pairs of input and output lines IO0 to IO7. Each of first and second memory cell arrays 461 and 462 includes word lines $WL_0$ to $WL_n$. FIG. 4 shows only the bit lines that a current column address selects. In particular, first memory cell array 461 includes pairs of bit lines BL0 to BL3, and second memory cell 462 array includes pairs of bit lines BL4 to BL7. The actual arrays would include $2^{15}$ pairs of bit lines. Alternatively, the 256 Mb DRAM semiconductor device 401 shown in FIG. 4 can include a plurality of smaller first and second memory cell arrays 461 and 462 where the accessed arrays are selected according to the column address.

In a read operation, pads 410 to 421 receive a row address signal having bits A0 to A11. No pads are used to receive a most significant row address bit A12, which in a conventional array would select either memory cell arrays 461 and 462 for access. A pin for receiving the most significant address bit A12 is disconnected from row decoder 451 of DRAM 401. Row address bits A0 to A11 transfers from pads 410 to 421 to corresponding address buffers 430 to 441. Address buffers 430 to 441 convert voltage levels of input row address bits A0 to A11 into voltage levels suitable for DRAM 401, and transfer the buffered (or converted) row address bits to row decoder 451.

Row decoder 451 decodes the row address and enables word lines designated by the row address among word lines $WL_0$ to $WL_n$. Row decoder 451 includes a decoder 453 and first and second word line drivers 455 and 456. Decoder 453 decodes the row address and transmits the selection signals to first and second word line drivers 455 and 456. A control port of first word line driver 455 connects enable terminals of tri-state buffers in first word line driver 455 to a power supply voltage Vcc. A control port of second word line driver 456 connects inverted enable terminals of tri-state buffers in second word line driver 456 to a ground voltage Vss. Therefore, first and second word line drivers 455 and 456 are always enabled and assert signals to word lines identified by the selection signals from decoder 453. Accordingly, word lines corresponding to the row address are simultaneously enabled in both first memory cell array 461 and second memory cell array 462. DRAM 401 enables twice as many word lines as those of DRAM 201 of FIG. 2 when a row address is input.

When enabled for a read, first memory cell array 461 and second memory cell array 462 respectively output four-bit data. I/O line sense amplifiers 471 to 474 amplify the data signals and output the four-bit data from first memory cell array 461 through I/O lines IO4 to IO7, and I/O line sense amplifiers 475 to 478 amplify the data signals and output the four-bit data from second memory cell array 462 through I/O lines IO0 to IO3.

Figure 1A:
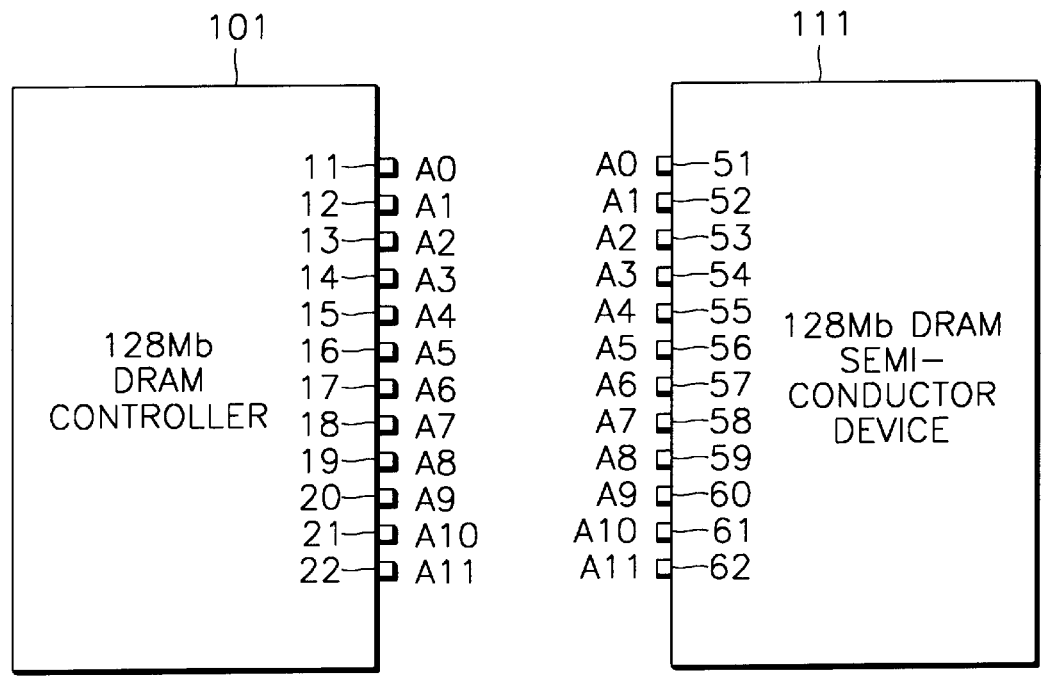
FIG. 1A shows address pins of a conventional 128 Mb DRAM and a controller for 128 Mb DRAM.
Figure 1B:
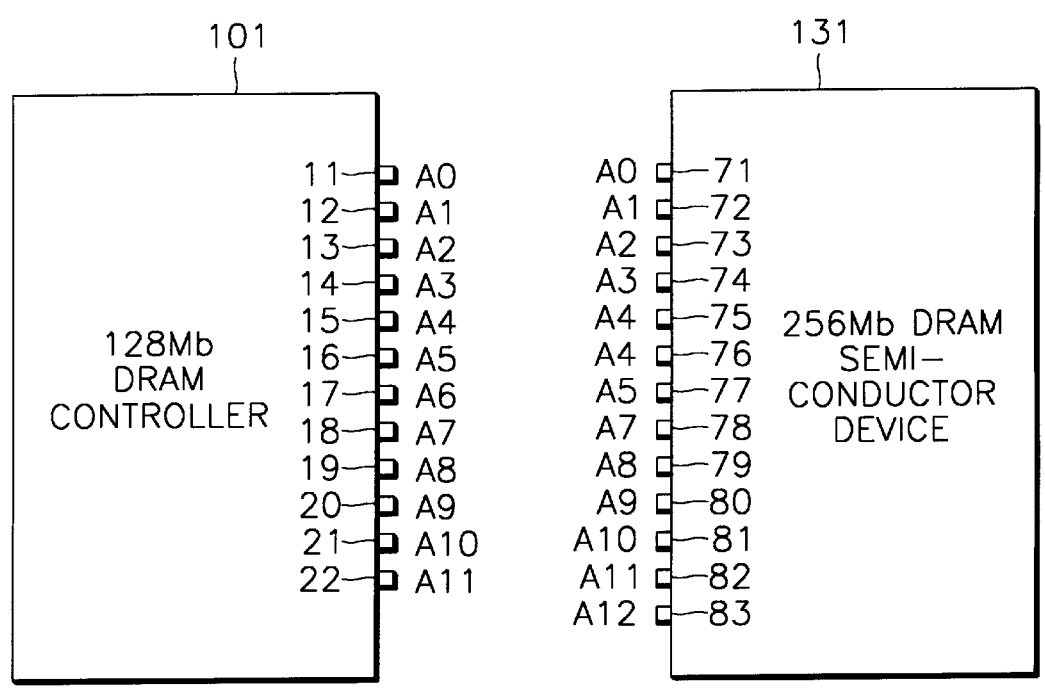
FIG. 1B shows address pins of a conventional 256 Mb DRAM and a controller for 128 Mb DRAM.
Figure 2:
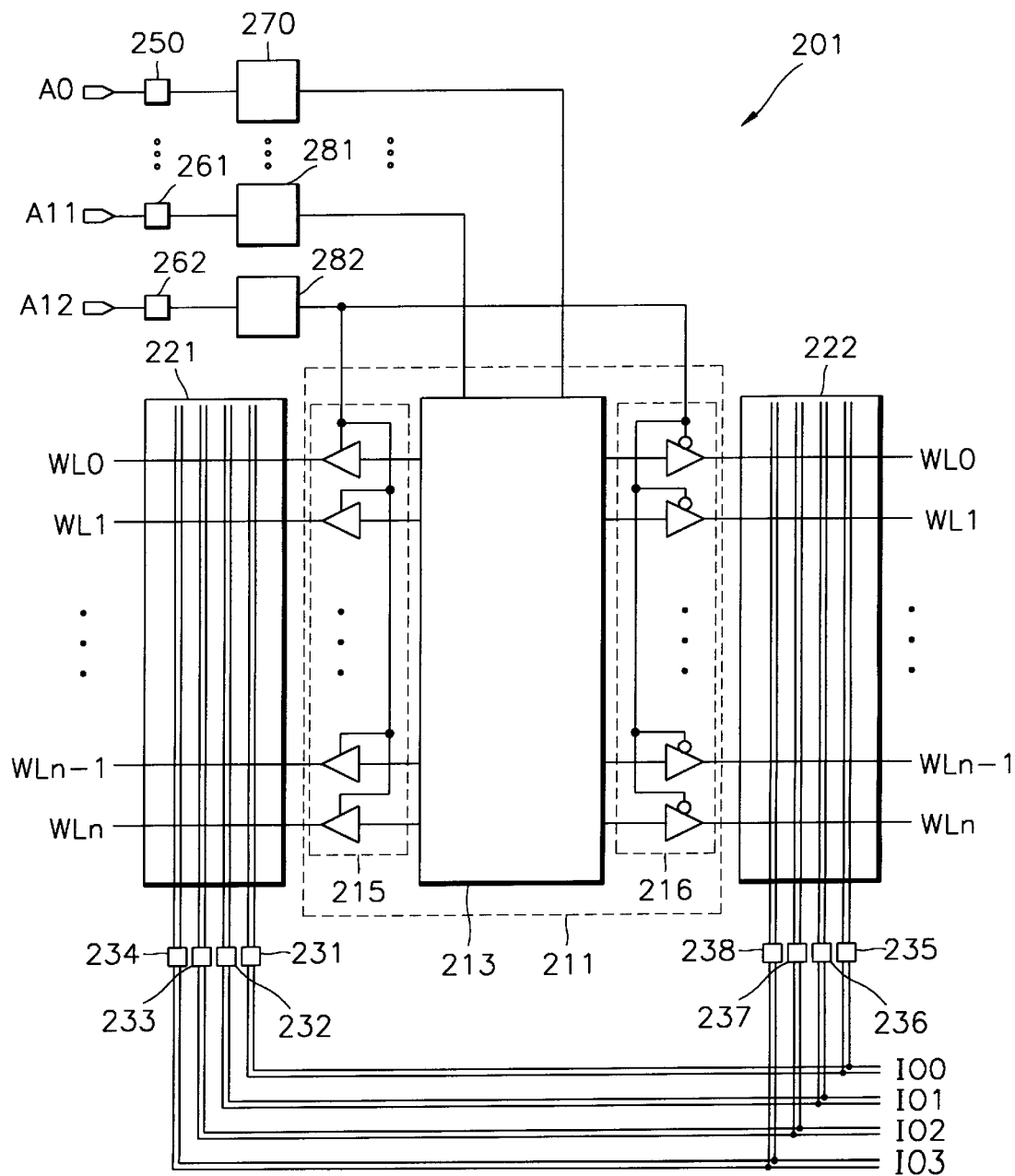
FIG. 2 is a block diagram of a conventional 256 Mb (64M×4 bits) DRAM.

The 256 Mb (64M×4) DRAM of FIG. 2 transfers data through the same I/O lines whether the data is from the first or second memory array. However, in DRAM semiconductor device 401, the number of pairs of I/O lines used is greater than the number of pairs of I/O lines used in the conventional DRAM. This is because the first and second memory cell arrays 461 and 462 are simultaneously enabled and input and output data items are divided into two groups respectively input to or output from the first and second memory cell arrays 461 and 462.

In a write operation, data bits are input through I/O lines IO0 to IO7 from the outside, and a row address having bits A0 to A11 is applied. Then, corresponding word lines of first and second memory cell arrays 461 and 462 are enabled since address bit A12 connects to the power supply voltage Vcc, and inverted address bit A12 connects to the ground voltage Vss. The data applied through I/O lines IO0 to IO7 are respectively stored in first and second memory cell arrays 461 and 462.

As mentioned above, the DRAM semiconductor device 401 receives a row address including 12 row address bits A0 to A11 and simultaneously enables some of the word lines $WL_0$ to $WL_n$ in first memory cell array 461 and some of the word lines $WL_0$ to $WL_n$ in second memory cell array 462. Accordingly, 8 bits of data are simultaneously output from the first and second memory cell arrays 461 and 462.

An advantage of 256 Mb (32M×8 bits) DRAM device 401 is that an alternative packaging or wire bonding of the chip can easily allow use of the chip to provide 256 Mb (64M×4 bits) DRAM device. In particular, address bits A12 and $\overline{A12}$ can be disconnected from the fixed voltages (power supply voltage Vcc and ground voltage Vss, respectively) and connected to an external address pin as in the conventional memories.

Figure 5:
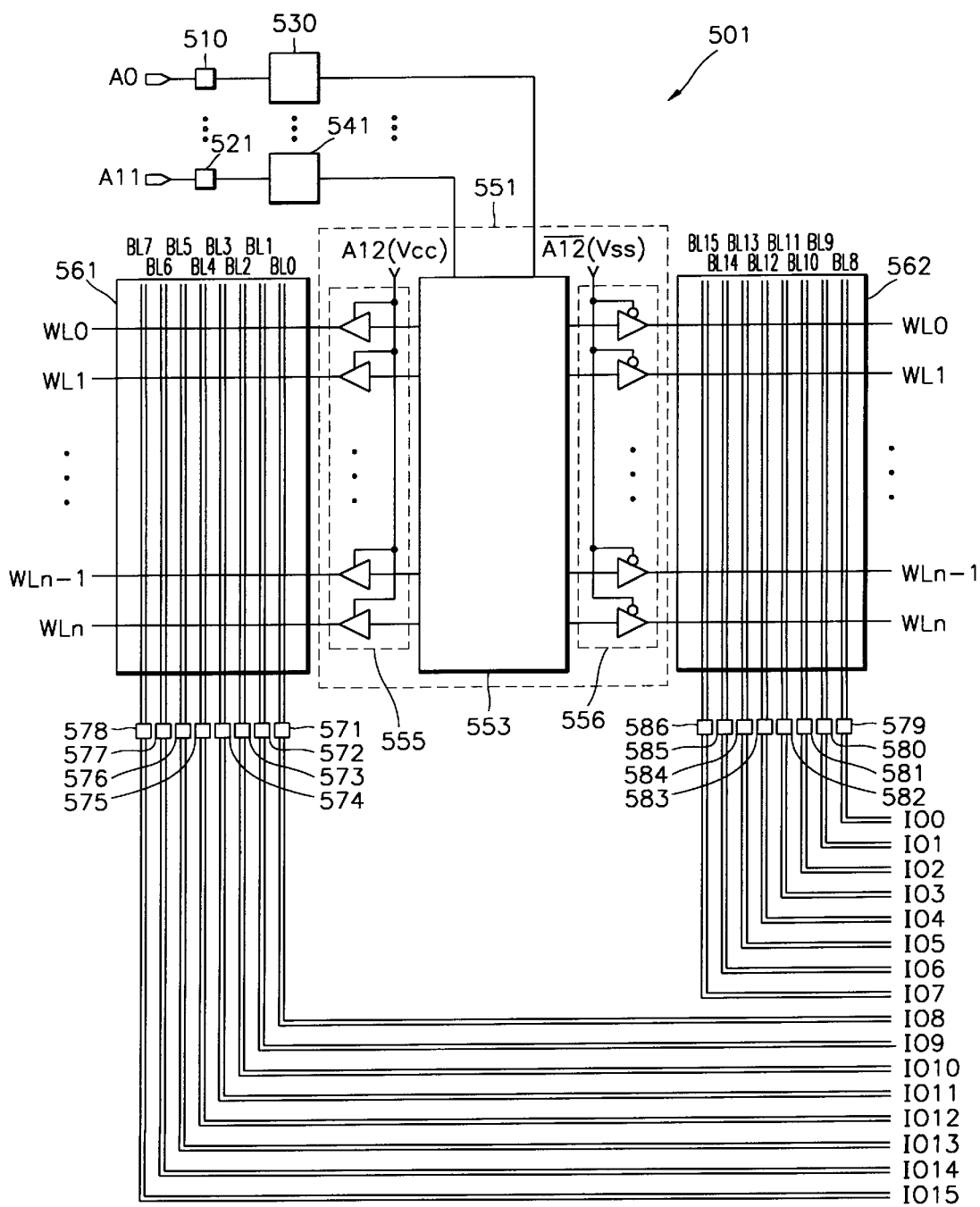
FIG. 5 is a block diagram of a 256 Mb (32M×8 bits) DRAM according to another embodiment of the present invention.

FIG. 5 is a circuit diagram of a 256 Mb (16M×16 bits) DRAM 501 in accordance with another embodiment of the present invention. DRAM 501 includes pads 510 to 521, address buffers 530 to 541, a row decoder 551, first and second memory cell arrays 561 and 562, I/O line sense amplifiers 571 to 586, and pairs of I/O (input and output) lines IO0 to IO15. Each of first and second memory cell arrays 561 and 562 includes word lines $WL_0$ to $WL_n$. First memory cell array 561 includes pairs of bit lines BL0 to BL7, and second memory cell array 562 includes pairs of bit lines BL8 to BL15, which are the bit lines that the column address selected.

In a read operation, a row address including bits A0 to A11 is input through pads 510 to 521 and address buffers 530 to 541. Address buffers 530 to 541 convert voltage levels of input row address bits A0 to A11 into voltage levels suitable for DRAM 501, and transfer the buffered (converted) row address to row decoder 551.

Figure 3:
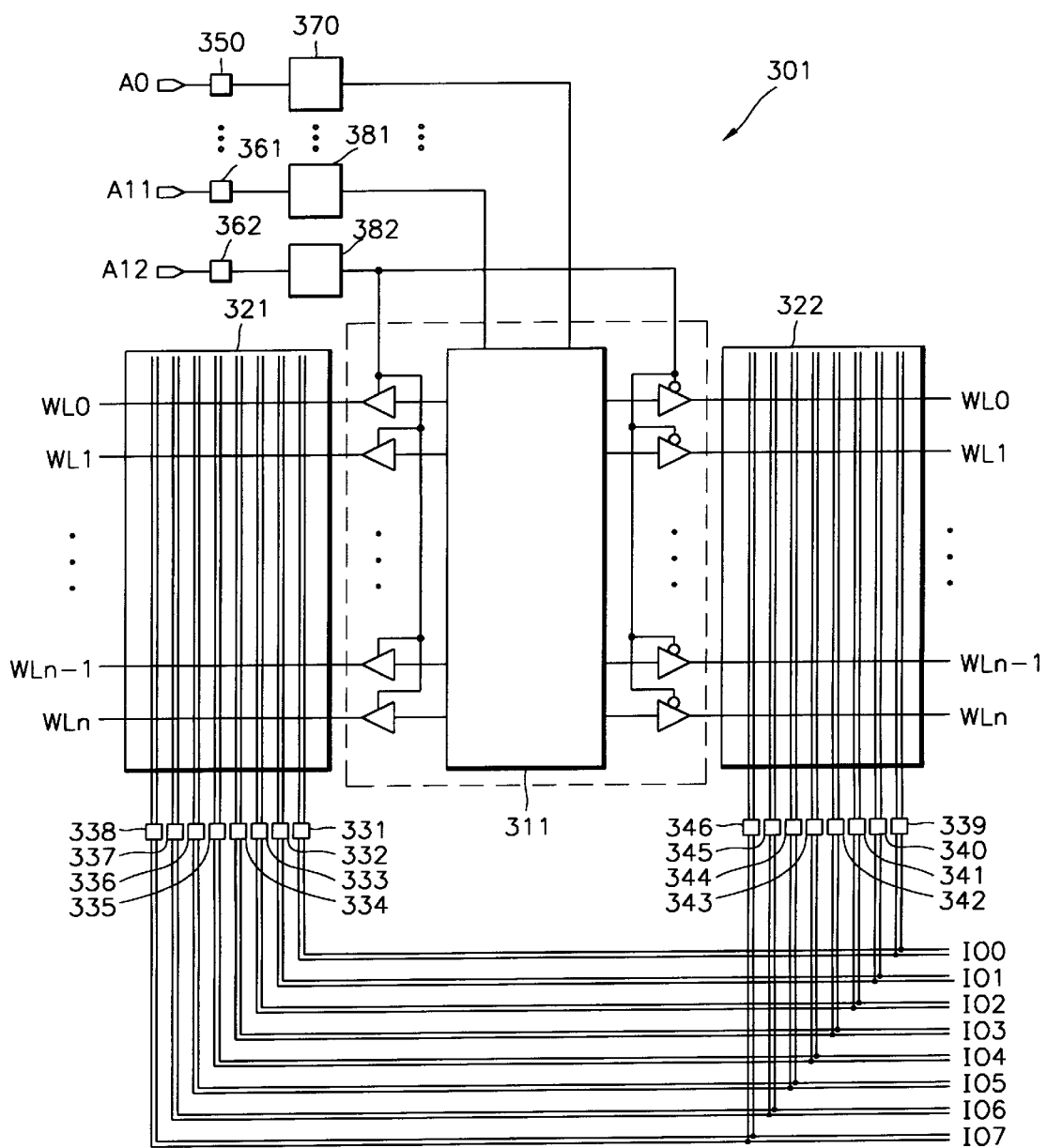
FIG. 3 is a block diagram of a conventional 256 Mb (32M×8 bits) DRAM.

Row decoder 551 decodes the row address and selects word lines designated by the row address among the word lines $WL_0$ to $WL_n$. Row decoder 551 includes a decoder 553 and first and second word line drivers 555 and 556. Decoder 553 decodes the row address and transmits row line select signals to first and second word line drivers 555 and 556. A control port of first word line driver 555 connects enable terminals of the tri-state buffers in first word line driver 555 to power supply voltage Vcc. A control port of second word line driver 556 connects inverted enable terminals of the tri-state buffers in the second word line driver 556 to ground voltage Vss. Therefore, first and second word line drivers 555 and 556 are always enabled and assert a signal to the word line that the row address selects. Accordingly, word lines corresponding to the row address are simultaneously enabled among word lines $WL_0$ to $WL_n$ in both first memory cell array 561 and second memory cell array 562. DRAM 501 enables twice as many word lines as DRAM 301 of FIG. 3 activates when a row address is input.

When enabled for a read, first memory cell array 561 and second memory cell array 562 respectively output eight bits of data. I/O line sense amplifiers 571 to 578 amplify and output the eight-bit data from first memory cell array 561 through I/O lines IO8 to IO15, and sense amplifiers 579 to 586 amplify and output the eight-bit data from second memory cell array 562 through I/O lines IO0 to IO7. Accordingly, DRAM 501 uses sixteen I/O lines IO0 to IO15 in data transfer because first and second memory cell arrays 561 and 562 are simultaneously enabled.

An advantage of chip in 256 Mb (16M×16 bits) DRAM device 501 is that an alternative packaging or wire bonding of the chip can easily allow use of the chip to provide 256 Mb (32M×8 bits) DRAM device. In particular, address bits A12 and $\overline{A12}$ can be disconnected from the fixed voltages (power supply voltage Vcc and ground voltage Vss, respectively) and connected to an external address pin as in the conventional memories.

Figure 6:
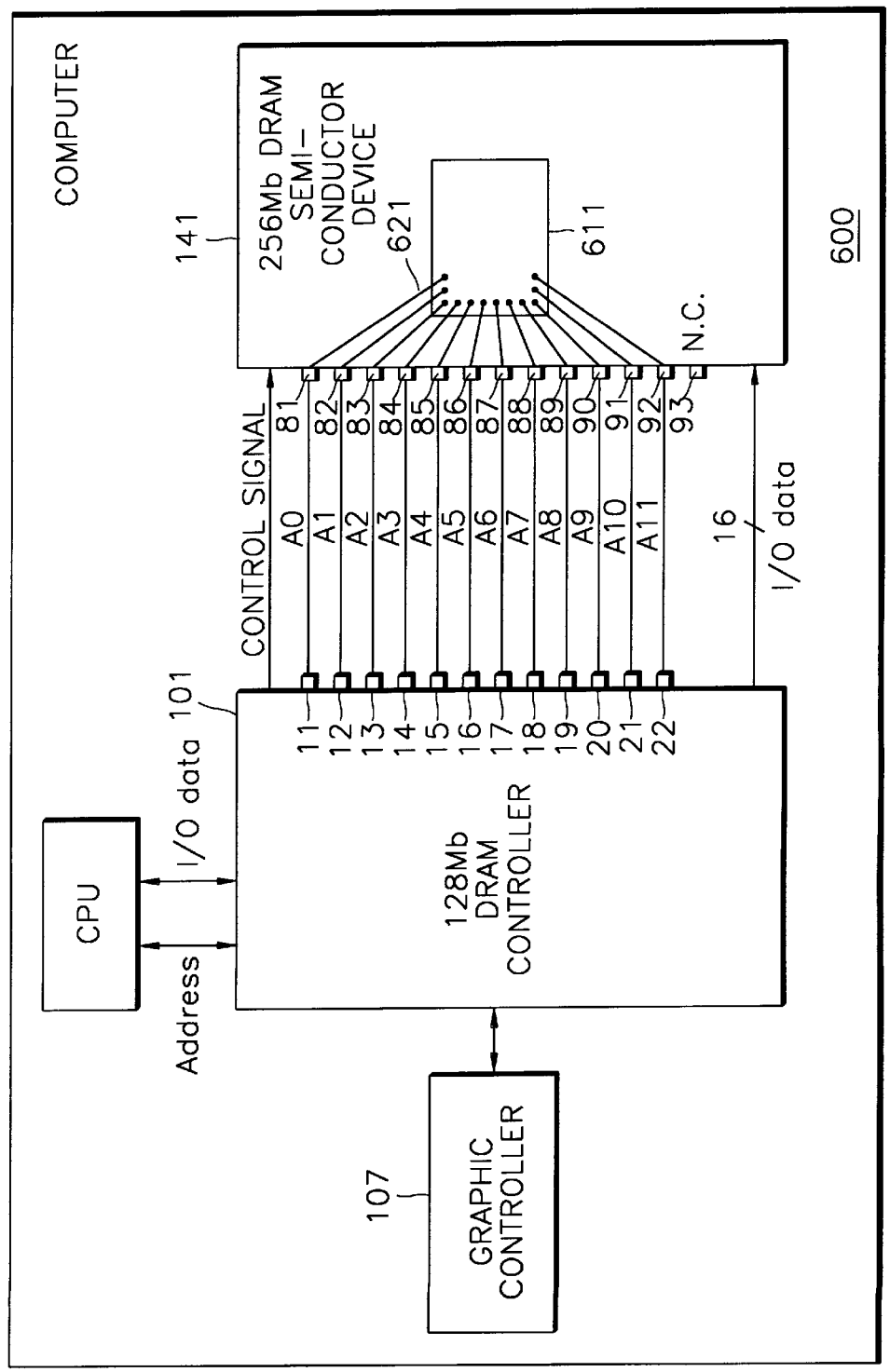
FIG. 6 is a block diagram of a computer illustrating use of the 256 Mb DRAM of FIG. 4 or 5 and a controller for 128 Mb DRAM.

FIG. 6 shows a computer 600 including a 256 Mb DRAM and a controller 101 for a 128 Mb DRAM. Although 256 Mb DRAM 141 has thirteen address pins 81 to 93, pin 93 corresponding to address bit A12 is not connected to provide a row address bit to 256 Mb DRAM chip 611. Controller 101 has twelve address pins 11 to 22 corresponding to address bits A0 to A11. Accordingly, because controller 101 and 256 Mb DRAM 141 has the same number of usable address pins for the row address, controller 101 for 128 Mb DRAM can control 256 Mb DRAM 141 provided that controller 101 also provides the appropriate number of column address bits. Reference numeral 621 denotes wires that electrically connect chip 611 to address pins 81 to 92.

As described above, a controller for 128 Mb DRAM can control a 256 Mb DRAM even though the controller has one fewer address pins than the 256 Mb DRAM has. Accordingly, memory capacity of a computer having a controller for 128 Mb DRAM can be upgraded so as to include 256 Mb DRAMs. For example, a CPU 105 or a graphic controller 107 of the computer 600 can communicate with DRAM controller 101 for data accesses. In response to an address from the CPU 105 or graphic controller 107, DRAM controller 101 can read or write 16 bits of information in chip 611, instead of 8 bits of information that a conventional 128 Mb DRAM would provide in response to DRAM controller 101.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A memory comprising:
   a plurality of memory arrays, each of which comprises a plurality of word lines;
   a decoder connected to receive a row address signal and select from each of the memory arrays a word line corresponding to the row address signal; and
   a plurality of row line drivers wherein each row line driver is connected between the decoder and a corresponding one of the memory arrays and when enabled, asserts an access signal to the selected row line in the corresponding memory array, each of the row line drivers having a control port that receives an enable signal controlling whether the row line driver is enabled, wherein
   the control ports of the row line drivers are permanently connected to fixed voltages that simultaneously enable all of the row line drivers.

2. The memory of claim 1, wherein a first of the control ports is connected to the supply voltage and a second of the control ports is connected to ground.

3. The memory of claim 1, wherein a control device connected to the memory provides the row address signal, and the memory contains at least twice a capacity of a memory device for which the control device was designed.

4. A computer comprising:
   a first memory device that comprises:
   a plurality of memory arrays, each of which comprises a plurality of word lines;
   a decoder connected to receive a row address signal and select from each of the memory arrays a word line corresponding to the row address signal; and
   a plurality of row line drivers wherein each row line driver is connected between the decoder and a corresponding one of the memory arrays and when enabled, asserts an access signal to the selected row line in the corresponding memory array, each of the row line drivers having a control port that receives an enable signal controlling whether the row line driver is enabled, wherein
   the control ports of the row line drivers are permanently connected to fixed voltages that simultaneously enable all of the row line drivers; and a control device connected to provide the address signal, wherein the first memory device contains at least twice a capacity of a second memory device for which the control device was designed.

5. The computer of claim 4, wherein the first memory device has twice as many input/output lines for data as does the second memory device.

6. A memory comprising:

a plurality of memory arrays, each of which comprises a plurality of word lines;

a decoder connected to receive a row address signal and select from each of the memory arrays a word line corresponding to the row address signal; and a plurality of row line drivers wherein each row line driver is connected between the decoder and a corresponding one of the memory arrays and when enabled, asserts an access signal to the selected row line in the corresponding memory array, each of the row line drivers having a control port that receives an enable signal controlling whether the row line driver is enabled, wherein wire bonding options of the memory include:

a first option that connects the control ports of the row line drivers to fixed voltages that simultaneously enable all of the row line drivers; and a second option that connects the control ports of the row line drivers to a pin that receives an address signal that selects which of the row line drivers are enabled.

7. The memory of claim 6, further comprising a plurality of input/output lines coupled to the memory arrays, wherein data input/output with the first option simultaneously uses twice as input/output lines as data output with the second option.

8. The memory of claim 6, wherein with the first option, a first of the control ports is connected to the supply voltage and a second of the control ports is connected to ground.

9. The memory of claim 6, wherein with the first option for wire bonding, a control device connected to the memory provides the row address signal, and the memory contains at least twice a capacity of a memory device for which the control device was designed.

* * * * *